United States Patent [19]
Reed

[11] Patent Number: 5,826,181
[45] Date of Patent: Oct. 20, 1998

[54] RADIO FREQUENCY NOISE REDUCTION ARRANGEMENT

[75] Inventor: Christopher John Reed, Harlow, Great Britain

[73] Assignee: Northern Telecom Limited, Montreal, Canada

[21] Appl. No.: 731,035

[22] Filed: Oct. 10, 1996

[30] Foreign Application Priority Data

May 18, 1996 [GB] United Kingdom ............ 9610498

[51] Int. Cl.⁶ .................................................. H04B 1/10
[52] U.S. Cl. .......................... 455/312; 455/296; 455/280; 455/303; 455/304; 455/137; 329/336; 329/327
[58] Field of Search .................................. 455/312, 303, 455/304, 306, 296, 280, 137; 329/323, 325, 319, 320, 327, 336, 346

[56] References Cited

U.S. PATENT DOCUMENTS

| 3,480,867 | 11/1969 | Sichak | 455/304 |
| 4,027,264 | 5/1977 | Gutleber | 455/306 |
| 4,985,684 | 1/1991 | Jentz et al. | 329/327 |
| 5,548,838 | 8/1996 | Talwar et al. | 455/304 |

FOREIGN PATENT DOCUMENTS 2288038  10/1995  United Kingdom.

*Primary Examiner*—Donnie L. Crosland
*Attorney, Agent, or Firm*—John D. Crane

[57] ABSTRACT

A frequency selective noise reduction circuit and finds application in receiver demodulator arrangements in mobile telecommunication base stations. A receive signal is divided into two paths. One path includes a Phase Lock Loop circuit (PLL) which is employed to identify noise. The noise signal is inverted and then combined with the other signal.

8 Claims, 4 Drawing Sheets

RADIO FREQUENCY NOISE REDUCTION ARRANGEMENT

FIELD OF THE INVENTION

This invention relates to a frequency selective noise reduction arrangement operating at radio frequency and, in particular but not exclusively, relates to such an arrangement for use in a receiver in a wide-band cellular radio base station.

BACKGROUND TO THE INVENTION

In the field of mobile radio, wideband receivers have been proposed as a cost effective architecture for base stations. A single radio receiver and wideband analogue to digital converter (ADC) would digitise all signals simultaneously with a digital signal processor (DSP) performing the channel selection. Accordingly, a wide band receiver would need to be capable of simultaneously receiving weak signals from mobile stations at the edge of a cell and strong signals from mobile stations very close to the base station installation whilst distinguishing from normal transmissions to installations operated by competing operators and other sources of interference. In order to be so capable, a receiver needs to have an instantaneous spurious free dynamic range approaching 100 dB which current wideband ADCs do not meet. Signals received at an ADC in excess of the ADC full-scale level will prevent reception of all other signals.

A desirable characteristic of a receiver would be the ability to reduce the power of the strongest signal prior to demodulation, whose signal to noise ratio is much higher than is required for good reception, to a level so as to fall within the available dynamic range of the ADC without affecting the other signals within the band. Such an arrangement should be adaptive so that the system is flexible and fast in operation. Traditional noise cancellation arrangements tend to be frequency indiscriminate and as such are unsuitable for the above application. For the purposes of this description, a noise signal is one which is either too large for the dynamic range of the signal processing means of the base station or one produced by an interferer.

OBJECT OF THE INVENTION

Accordingly, it is an object of the present invention to provide an improved frequency selective noise reduction arrangement.

SUMMARY OF THE INVENTION

In accordance one aspect of the present invention, there is provided a frequency selective noise reduction arrangement operating at radio frequency comprising an input, a divider, a combiner, an output and first and second paths between the divider and combiner; wherein the first path possesses a phase lock loop circuit, an amplifier and a phase inverter and the second path is connected to the combiner; wherein the divider is operable to divide an input signal into the first and second paths and the first path is operable to select, amplify and phase invert a noise signal present in the input signal; wherein the combiner is operable to combine the signal of the first path with the signal of the second path; and wherein the phase inverted and amplified noise signal of the first path can be combined with the noise signal in the second path by the combiner whereby the noise is reduced from the output signal at the output of the combiner.

Preferably the amplifier in the first path is a variable amplifier or attenuator which is operable to vary the amplitude of the phase inverted signal whereby the noise in the first path is reduced. A power detector can be associated with the combiner as part of a feedback circuit to determine the extent of the amplification necessary in the variable amplifier. Alternatively, the feedback circuit can be associated with a detector in an associated analogue to digital converter. An amplifier or attenuator can also be provided in the second path which amplifier or attenuator may also be variable and controlled by a feedback loop. By the use of such an arrangement within, for example, a cellular radio base station, the need for a large number of mixers, amplifiers, filters and analogue to digital converters is conveniently avoided, since the noise reduction circuit can operate across all channels enabling a reduction in components, cost and size amongst other advantages.

In accordance with another aspect of the present arrangement, there is provided a method of operating a frequency selective noise reduction arrangement operating at radio frequency comprising an input, a divider, a combiner, first and second paths between the divider and an output; wherein, in the first path there is provided a phase lock loop circuit, an amplifier and a phase inverter and the second path is connected to the combiner; the method comprising the steps of dividing an input signal by means of the divider into the first and second paths; selecting, amplifying and phase inverting a noise signal present in the first path feeding the signal in the second path from the divider to the combiner; and combining the phase inverted and amplified signal from the first path with the signal in the second path by the combiner, whereby noise is reduced from the output signal.

The phase of the noise signal is thus inverted and then adaptively amplified by the variable gain amplifier; the phase locked loop (PLL) at an intermediate frequency (IF) replicates the dominant signal before adaptively reducing it.

In accordance with a further aspect of the invention, there is provided a method of receiving signals in a telecommunications base station receiver which includes a frequency selective noise reduction arrangement operating at radio frequency; which noise reduction arrangement comprises an input, a divider, a combiner, first and second paths between the divider and an output; wherein, in the first path there is provided a phase lock loop circuit, an amplifier and a phase inverter and the second path is connected to the combiner; the method comprising the steps of receiving signals from an antenna; passing the signals received from the antenna to the noise reduction arrangement, dividing the signal input to the noise reduction arrangement by means of the divider into the first and second paths; selecting, amplifying and phase inverting a noise signal present in the first path; feeding the signal in the second path from the divider to the combiner; combining the phase inverted and amplified signal from the first path with the signal in the second path by the combiner whereby noise is reduced from a signal output from the noise reduction arrangement; and feeding the output signal to an analogue to digital converter prior to further signal processing and demodulation.

BRIEF DESCRIPTION OF THE DRAWINGS

Embodiments of the invention will now be described with reference to the accompanying drawings, wherein.

DETAILED DESCRIPTION OF PREFERRED EMBODIMENTS

Figure 1:
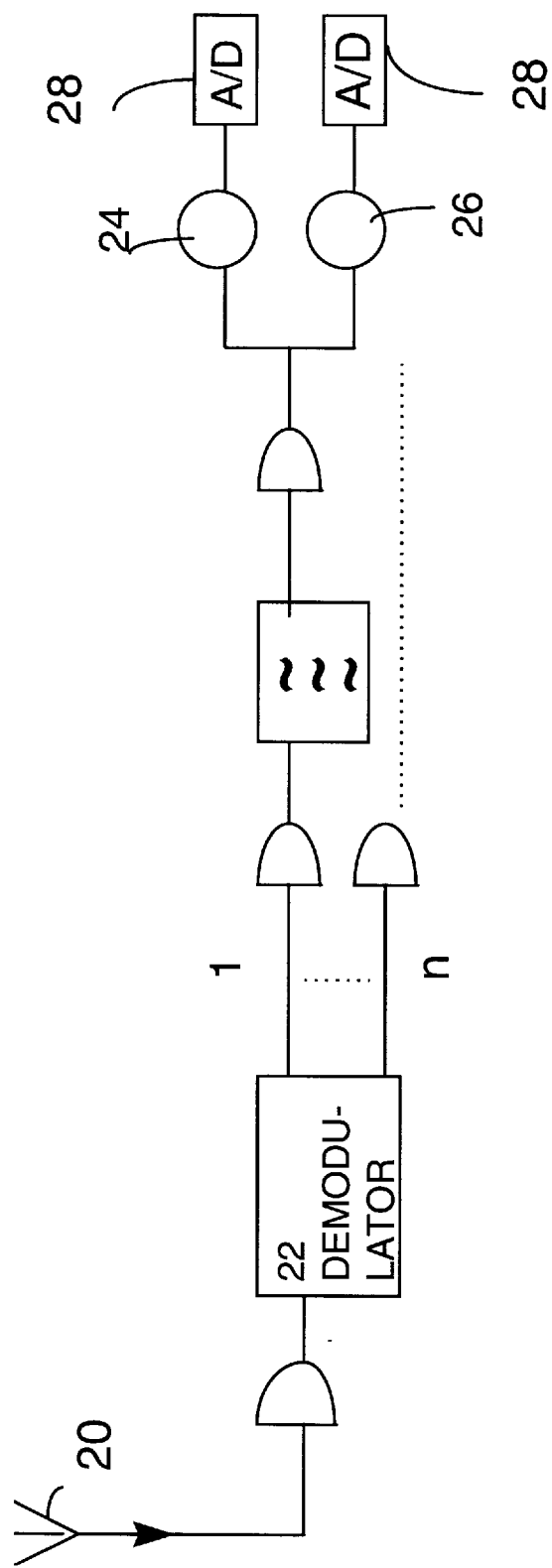
FIG. 1 shows a conventional antenna receive path for a cellular radio base station.

FIG. 1 shows a diagrammatic representation of a conventional antenna receive path as typically used in a cellular radio base station. Signals from the antenna 20 are fed to a demodulator 22 which separates the a number (n, where n≦20) of signals within each frequency band. The signals from the demodulator are then amplified, mixed to an intermediate frequency, passed through a band pass filter to select signals at the intermediate frequency, and amplified further before being passed to in-phase and quadrature mixers 24, 26 prior to the analogue-to-digital converters 28 where the analogue signals are converted to digital representation. Separate routes from the demodulator to the analogue-to-digital converters exist for all frequency bands which results in a complex design and costly implementation thereof.

Figure 2:
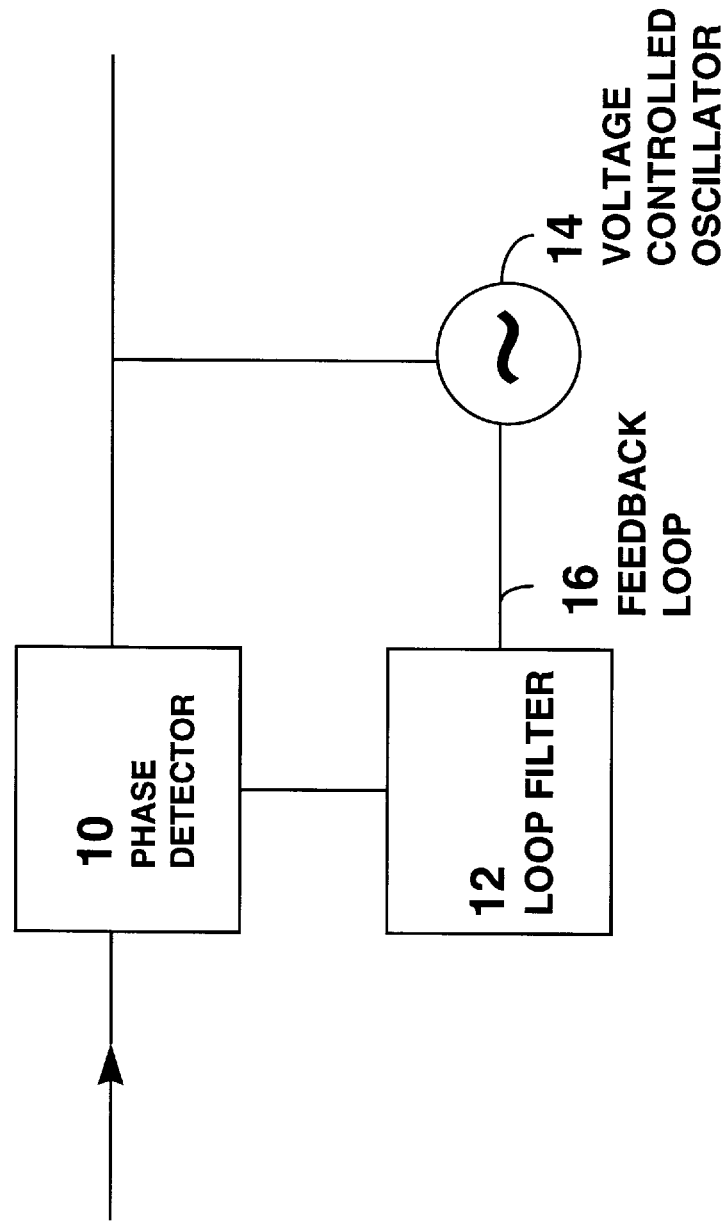
FIG. 2 depicts a basic phase lock loop layout.

Frequency selective arrangements are common and typically employ phase locked loop (PLL) circuits. The basic structure of a PLL is shown in FIG. 2. The main components consist of a phase detector 10, a loop filter 12, a voltage controlled oscillator 14 and a feed back loop 16 which typically incorporates a divider. The PLL compares an incoming signal, such as a clock signal, with its feedback clock. The difference between these two signals generates an error signal proportional to the gain of the phase detector, Kd, which error signal is applied to the loop filter. The loop filter typically consists of an active single pole-zero filter such as a standard Miller integrator, providing both high dc gain, which reduces input phase error (usually the gain of the filter, G is not less than 40 dB) and low frequency bandwidth. The output of this active filter adjusts a Voltage Controlled Oscillator (VCO) or a crystal VCO (VCXO) to lock the output signal to the input signal. The VCO however may have a centre frequency ($f_o$) at a much higher frequency (depending on system requirements) and, therefore, a divide down counter may be placed within the feedback path, which completes the loop.

Figure 3:
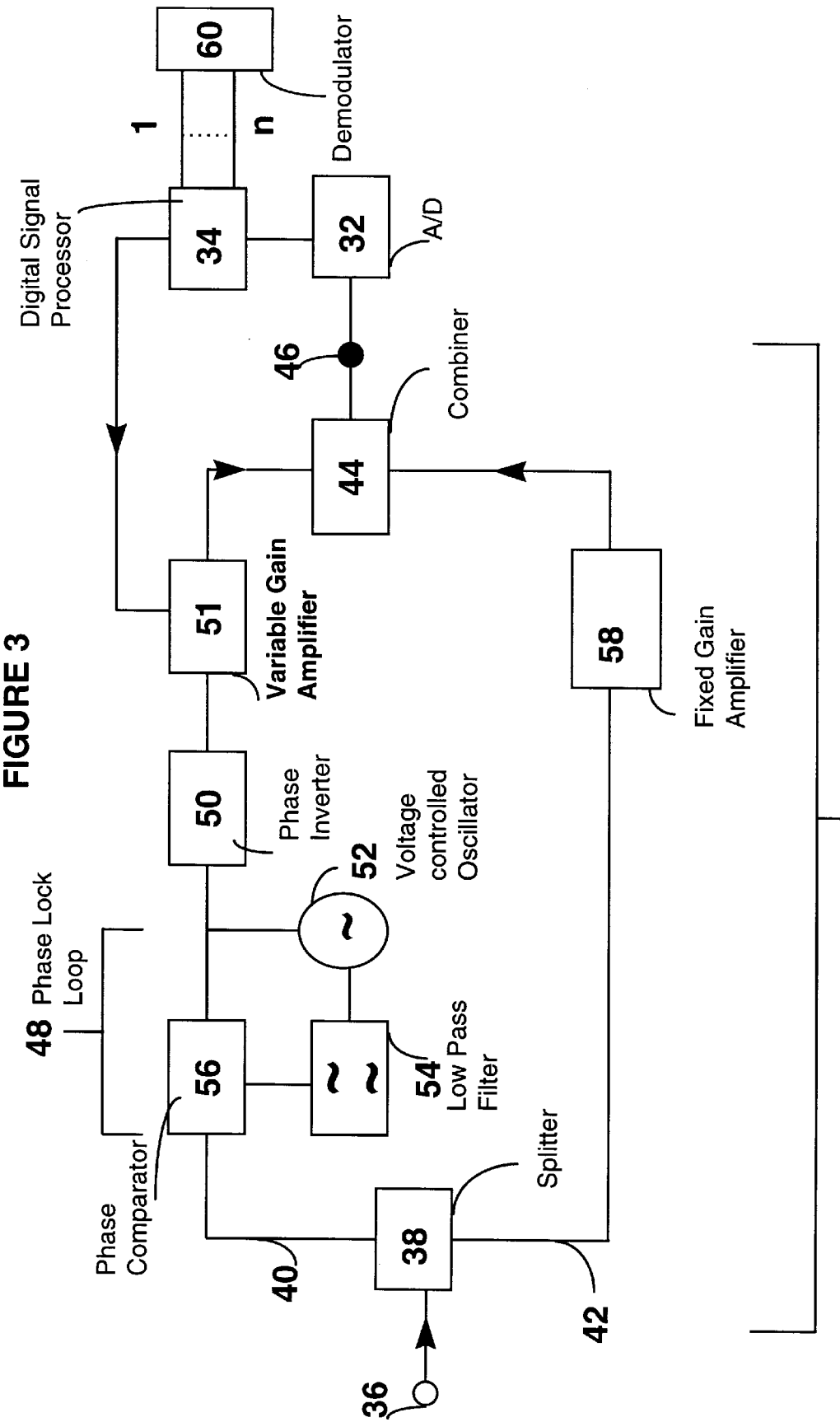
FIG. 3 shows an embodiment of the invention.

Referring now to FIG. 3, there is shown one embodiment of the present invention. The noise reduction circuit 30 is operable in conjunction with a wide band analogue to digital converter 32 which outputs to a digital signal processing means 34. The noise reduction circuit comprises an input at 36, a splitter 38 which splits into a first path 40 and a second path 42, a combiner 44 which combines the outputs of the first and second paths and an output at 46. The first arm leads from the splitter to a phase lock loop 48, wherefrom the signals pass to a phase inverter 50 through a variable gain amplifier 51 to arrive at the combiner 44. The phase lock loop circuit comprises a voltage controlled oscillator 52 and a low-pass filter 54 acting on a phase comparator 56. The variable gain amplifier receives a feedback control signal from the digital signal processor 34. The second arm includes a fixed gain amplifier 58.

In operation, an input signal, instead of being fed directly to an input of an analogue to digital converter after down conversion, is fed to an input 36 of a noise reduction circuit. The signal input to the circuit is split at splitter 38. The signal of the first path passes from the splitter to the phase comparator which is set so that the phase lock loop locks with a constant phase relationship. The whole band of interest is fed into the reference of the phase lock loop whose loop bandwidth is wide enough to track the modulation index of the noise signal. The cut off frequency of the low pass filter 54 corresponds to the noise signal modulation deviation (which will be a known operating parameter). The phase comparator compares the phase of a periodic input signal against the phase of the voltage controlled oscillator: the output of the phase comparator is a measure of the phase difference between its two inputs. The difference voltage is then filtered by the loop filter 54 and applied to the voltage controlled oscillator 52. The control voltage of the voltage controlled oscillator changes the frequency in a direction that reduces the phase difference between the input signal and the local oscillator.

In normal circumstances, when a phase lock loop is locked, the control voltage is such that the frequency of the voltage controlled oscillator is exactly equal to the frequency of the input signal. In the case of the use of a phase lock loop for the reduction of a dominant noise signal the noise signal is selected. The phase of the output is inverted by phase inverter 50 and then adaptively amplified by the variable gain amplifier 51. The signal of the second path is passed from the splitter to a combiner 44 after amplification by amplification means 58.

At the combiner, this signal is combined with the amplified input signal of the first arm. The amplifier enables both noise signals at the combiner 44 to be of the same order of magnitude, whereby the amplified noise signal of the first arm is cancelled by the phase inverted amplified noise signal in the second arm. The signal is passed from the output 46 to the wide band analogue to digital converter, through the digital down converter to a demodulator 60.

The phase of the noise signal is thus inverted and then adaptively amplified by the variable gain amplifier; the phase locked loop (PLL) at an intermediate frequency (IF) replicates the dominant signal. The variable gain amplifier amplifies the inverted signal so that both noise signals input at the combiner are of the same order of magnitude, whereby the amplified noise signal of the second path is reduced by the phase inverted amplified noise signal in the first path. The noise level is reduced to an acceptable level: it need not necessarily be completely cancelled. The power of a strong signal, whose signal to noise ratio is much higher than is required for good reception, can be reduced to a level so as to fall within the available dynamic range of the ADC without affecting the other signals within the band. Problems experienced with previous systems in overload situations where the desired signal is too strong and the analogue to digital converter operates in a non-linear mode can thus be prevented.

Perturbation would be suitable for the control algorithm; the power detection could be carried out within the digital signal processor, after the analogue to digital conversion or by measurement of the analogue signal applied to the analogue to digital converter. The output of the phase lock loop could be disabled when noise reduction is not required. Since the noise reduced signal may itself be demodulated, full noise reduction is not desirable. Alternative feedback means to the variable gain amplifier 51 (or attenuator) may be employed to one originating in the digital signal processing means 34. For instance sensors may be present in the combiner.

Figure 4:
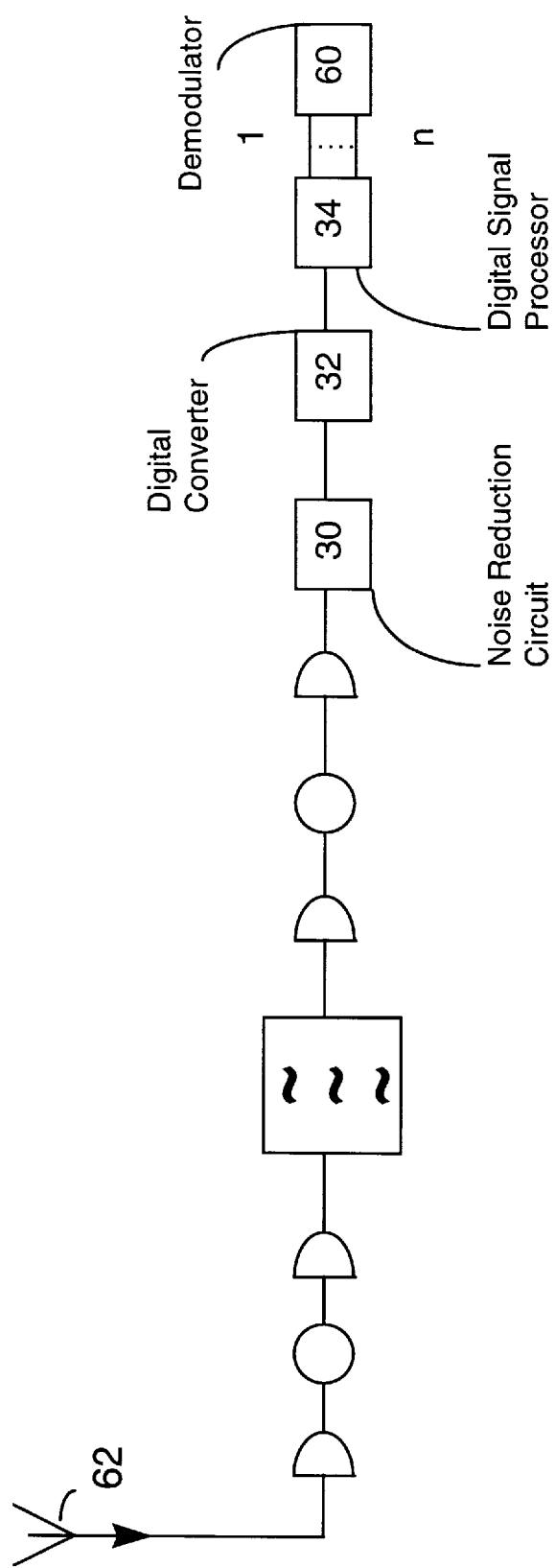
FIG. 4 shows a receivr path from a cellular base station antenna employing an embodiment of the invention.

FIG. 4 shows an arrangement in accordance with the present invention corresponding to the conventional arrangement shown in FIG. 2. Signals from an antenna 62 are passed through various amplifiers, mixers and filters to the noise reduction circuit where noise reduction can be performed before the conversion of signals to digital representation and demodulation. The multiplication (multiplication factor=n) of mixers, amplifiers, filters and analogue to digital converters is conveniently avoided, enabling a reduction in components, cost and size amongst other advantages.

The use of the loop filter (54) within a PLL may require an unreasonable amount of time to provide a locked output clock. This problem may be overcome by increasing the PLL jitter bandwidth to provide a rapid lock-in time. Once in lock, the PLL would revert to its intended noise modulation deviation bandwidth.

The above approach will work for constant envelope signals only (FM, FSK, GMSK etc.) and when one signal is significantly more powerful than the average. Both of the above will be satisfied for AMPS and GSM.

I claim:

1. A frequency selective noise reduction arrangement operating at radio frequency comprising an input, a divider, a combiner, an output and first and second paths between the divider and combiner;

wherein the first path possesses a phase lock loop circuit, an amplifier and a phase inverter and the second path is connected to the combiner;

wherein the divider is operable to divide an input signal into the first and second paths and the first path is operable to select, amplify and phase invert a noise signal present in the input signal;

wherein the combiner is operable to combine the signal of the first path with the signal of the second path; and wherein the phase inverted and amplified noise signal of the first path can be combined with the noise signal in the second path by the combiner whereby the noise is reduced from the output signal at the output of the combiner.

2. An arrangement according to claim 1 wherein the amplifier in the first path is a variable amplifier which is operable to vary the amplitude of the phase inverted signal.

3. An arrangement according to claim 1 including a power detector associated with the combiner in a feedback loop and wherein the amplifier in the first path is a variable amplifier which is operable to vary the amplitude of the phase inverted signal, wherein the variable amplifier is controlled by the feedback loop.

4. A frequency selective noise reduction arrangement operating at radio frequency comprising an input, a divider, a combiner, an output and first and second paths between the divider and combiner;

wherein the first path possesses a phase lock loop circuit, an amplifier and a phase inverter and the second path is connected to the combiner;

wherein the divider is operable to divide an input signal into the first and second paths and the first path is operable to select, amplify and phase invert a noise signal present in the input signal;

wherein the combiner is operable to combine the signal of the first path with the signal of the second path;

wherein the phase inverted and amplified noise signal of the first path can be combined with the noise signal in the second path by the combiner whereby the noise is reduced from the output signal at the output of the combiner; and wherein there is an amplifier in the second path.

5. An arrangement according to claim 4 wherein the amplifier in the first path is a variable amplifier which is operable to vary the amplitude of the phase inverted signal, and wherein the amplifier in the second path is a variable amplifier and wherein there is a power detector associated with the combiner in a feedback loop, wherein the amplifier in the second path is controlled by the feedback loop.

6. A telecommunications base station receiver incorporating an arrangement according to claim 1.

7. A method of operating a frequency selective noise reduction arrangement operating at radio frequency comprising an input, a divider, a combiner, first and second paths between the divider and an output;

wherein, in the first path there is provided a phase lock loop circuit, an amplifier and a phase inverter and the second path is connected to the combiner;

the method comprising the steps of dividing an input signal by means of the divider into the first and second paths;

selecting, amplifying and phase inverting a noise signal present in the first path feeding the signal in the second path from the divider to the combiner; and combining the phase inverted and amplified signal from the first path with the signal in the second path by the combiner whereby noise is reduced from the output signal.

8. A method of receiving signals in a telecommunications base station receiver which includes a frequency selective noise reduction arrangement operating at radio frequency; which noise reduction arrangement comprises an input, a divider, a combiner, first and second paths between the divider and an output;

wherein, in the first path there is provided a phase lock loop circuit, an amplifier and a phase inverter and the second path is connected to the combiner;

the method comprising the steps of receiving signals from an antenna;

passing the signals received from the antenna to the noise reduction arrangement, dividing the signal input to the noise reduction arrangement by means of the divider into the first and second paths;

selecting, amplifying and phase inverting a noise signal present in the first path;

feeding the signal in the second path from the divider to the combiner;

combining the phase inverted and amplified signal from the first path with the signal in the second path by the combiner whereby noise is reduced from a signal output from the noise reduction arrangement; and feeding the output signal to an analogue to digital converter prior to further signal processing and demodulation.

\* \* \* \* \*